US007573183B2

(12) United States Patent
Riabzev

(10) Patent No.: US 7,573,183 B2
(45) Date of Patent: Aug. 11, 2009

(54) FLEXTENSIONAL VIBRATION-FREE PRESSURE OSCILLATOR

(75) Inventor: Sergey Riabzev, Afula (IL)

(73) Assignee: Ricor Ltd., En-Harod Ihud (IL)

( * ) Notice: Subject to any disclaimer, the term of this patent is extended or adjusted under 35 U.S.C. 154(b) by 0 days.

(21) Appl. No.: 12/208,380

(22) Filed: Sep. 11, 2008

(65) Prior Publication Data

US 2009/0072669 A1 Mar. 19, 2009

Related U.S. Application Data

(60) Provisional application No. 60/973,514, filed on Sep. 19, 2007.

(51) Int. Cl.
*H01L 41/08* (2006.01)

(52) U.S. Cl. ....................................... 310/334; 310/337

(58) Field of Classification Search ................. 310/334, 310/337

See application file for complete search history.

(56) References Cited

U.S. PATENT DOCUMENTS 4,922,470 A * 5/1990 McMahon et al. .......... 367/163
5,805,529 A * 9/1998 Purcell ........................ 367/163
6,584,039 B1 * 6/2003 Purcell et al. ............... 367/176
7,394,181 B2 * 7/2008 Su et al. ..................... 310/328
2003/0058741 A1 * 3/2003 Franklin ..................... 367/174
2005/0152222 A1 * 7/2005 Kaufman et al. ............ 367/163
2008/0238260 A1 * 10/2008 Xu et al. ..................... 310/339

* cited by examiner

*Primary Examiner*—Mark Budd
(74) *Attorney, Agent, or Firm*—Dekel Patent Ltd.; David Klein

(57) ABSTRACT

An apparatus for producing pressure oscillation of a fluid, incorporating hermetically sealed casing including a housing, a cover, a hermetic seal, a cylindrical flextensional transducer driven by piezoelectric or magnetostrictive driving member positioned in the inner cavity of the transducer and secured between two endplates, two springs providing for axial pre-loading and centering of the cylindrical flextensional transducer, two internal seals preventing fluid leakage between swept volume and other structure volumes; hermetic connectors for electrical connecting of the actuation member to energizing means, and fluid flow channel.

3 Claims, 4 Drawing Sheets

FLEXTENSIONAL VIBRATION-FREE PRESSURE OSCILLATOR

CROSS-REFERENCE TO RELATED APPLICATIONS

This application claims priority under 35 USC §119 to U.S. Provisional Patent Application Ser. No. 60/973,514, filed Sep. 19, 2007, which is incorporated herein by reference.

FIELD OF THE INVENTION

The present invention relates to fluid pressure oscillators for use in compressors and pumps. More specifically, but without limitations, the present invention relates to a gas compressor incorporating a right circular cylindrical flextensional transducer driven by piezoelectric or magnetostricitive driving member, for producing gas pulses further used in cryogenic engines for generation of thermodynamic cycles.

BACKGROUND OF THE INVENTION

Flextensional transducers are known in the art. One type of flextensional transducer has a flexible outer shell and a piezoelectric stack of elements. When actuated, the stack expands and contracts, thereby flexing the shell. The shell is coupled to and projects acoustic energy into an acoustic medium, such as water. Such transducers are limited by the amount of prestress that can be imposed on the piezoelectric stack to avoid exposure to tensile stress. The characteristics of the transducer are variable with depth in the acoustic medium. In general, the maximum depth of operation of the piezoelectrically driven flextensional transducer is governed by allowable ceramic stress and performance degradation.

Another type of flextensional transducer uses a magnetically driven element, which employs a moving coil in a magnetic field instead of the piezoelectric stack. The transducer shell is driven by energizing the coil which flexes the walls of the transducer inwardly or outwardly.

SUMMARY OF THE INVENTION

The present invention seeks to provide an improved flextensional vibration-free pressure oscillator apparatus, as described more in detail hereinbelow.

In one embodiment, the oscillator apparatus includes a hermetically sealed casing including a housing, a cover, a hermetic seal, a cylindrical flextensional transducer driven by piezoelectric or magnetostrictive driving member positioned in the inner cavity of the transducer and secured between two endplates, two springs providing for axial preloading and centering of the cylindrical flextensional transducer, two internal seals preventing fluid leakage between the swept volume and other structure volumes, hermetic connectors for electrical connecting of the actuation member to energizing means, and a fluid flow channel for fluid to flow therethrough to surround the elastomeric molding of the frame.

BRIEF DESCRIPTION OF THE DRAWINGS

The present invention will be understood and appreciated more fully from the following detailed description, taken in conjunction with the drawings in which.

DETAILED DESCRIPTION OF EMBODIMENTS

In general, the cylindrical flextensional transducer comprises a tubular frame made of a rigid thick-walled tube, wherein circular slots and longitudinal slits are made so as to provide required flexibility of the frame. The frame slits are hermetically sealed by molding an elastomeric material around the frame. The flextensional transducer provides for translation of a small longitudinal relative deflection of the ends, driven by the driving member, into amplified radial deflection of external cylindrical surface, which yields a pressure oscillation of a surrounding fluid. Due to the completely symmetric design, any oscillating portion of the transducer structure is counterbalanced by oscillation of a similar, symmetrically positioned portion, such that the oscillations cancel each other and the overall vibration of the entire apparatus tends to zero. Also, the transducer does not generate wideband acoustical noise and vibration because there are no sliding joints, gaps and colliding parts in the structure.

Figure 1A:
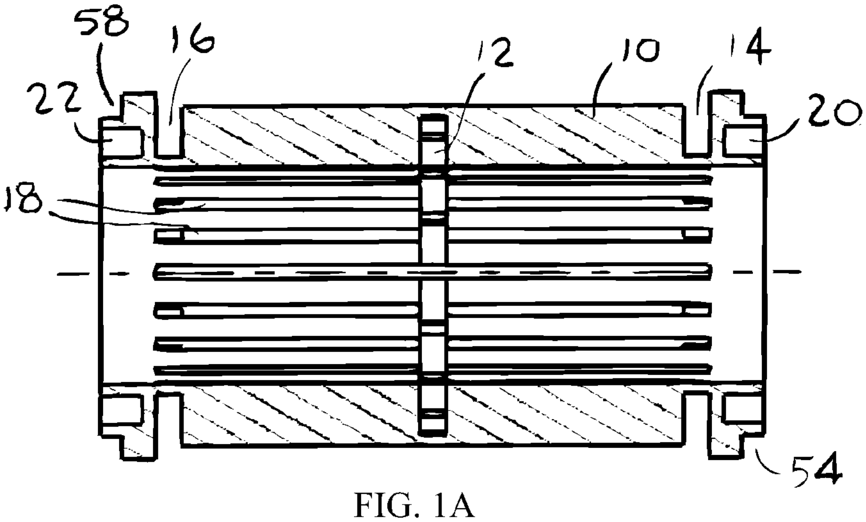
FIGS. 1A and 1B are simplified sectional and pictorial illustrations of a flextensional transducer frame, constructed and operative in accordance with an embodiment of the present invention.
Figure 1B:
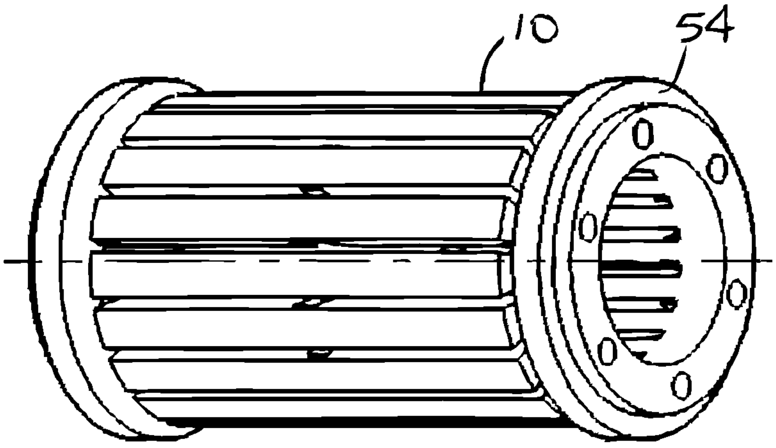

Referring to FIGS. 1A-1B, the flextensional acoustical transducer includes a tubular right circular thick-walled frame 10. The frame 10 includes an internal circular slot 12 disposed in the middle thereof to form a middle flexible region. A first external circular slot 14 is formed near one end of the frame to form a first end flexible region. A second external circular slot 16 is formed near the other end thereof to form a second end flexible region.

A plurality of longitudinal slits 18 are spaced around the circumference of the frame. Longitudinal slits 18 are disposed in-between and overlap the first and second external circular slots.

A first sealing groove 20 is disposed on one end of the frame and a second sealing groove 22 is disposed on the other end thereof. An elastomeric molding 24 (FIGS. 4A-4B, and also seen in FIGS. 2A-3B) fills the slits and slots in the frame 10, covering the side surfaces of the frame by thin layer.

Figure 2A:
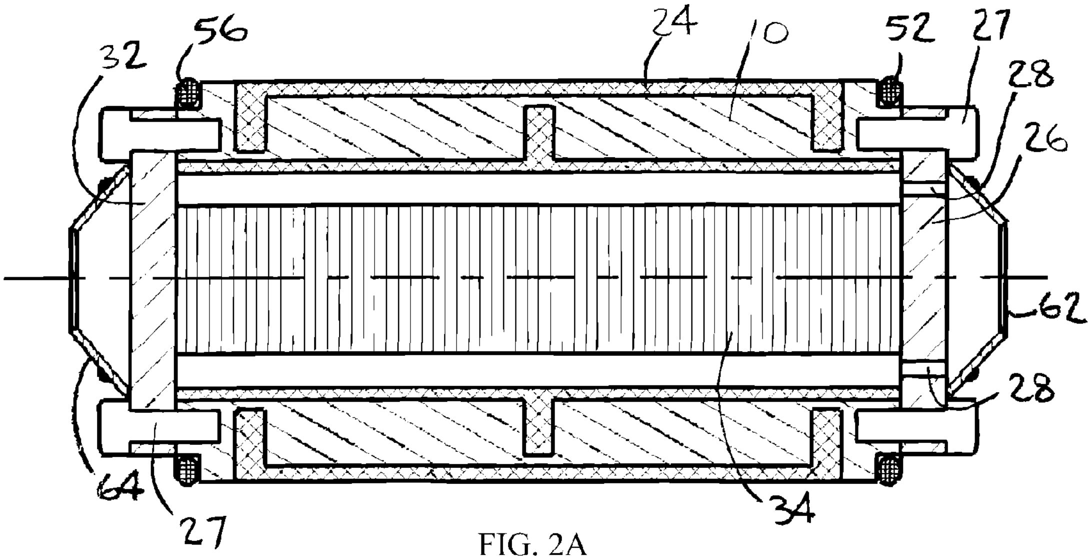
FIGS. 2A and 2B are simplified sectional and pictorial illustrations of a transducer assembly for the flextensional transducer, constructed and operative in accordance with an embodiment of the present invention.
Figure 2B:
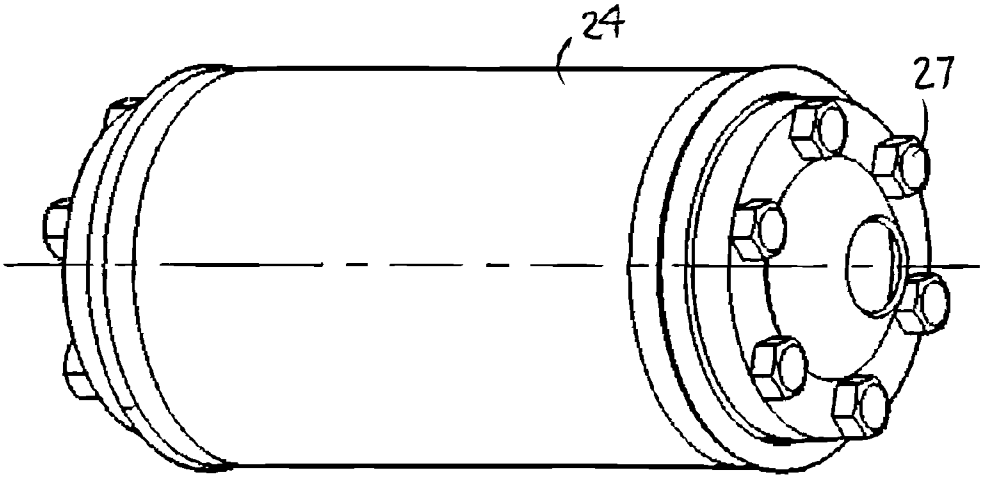
Figure 3:
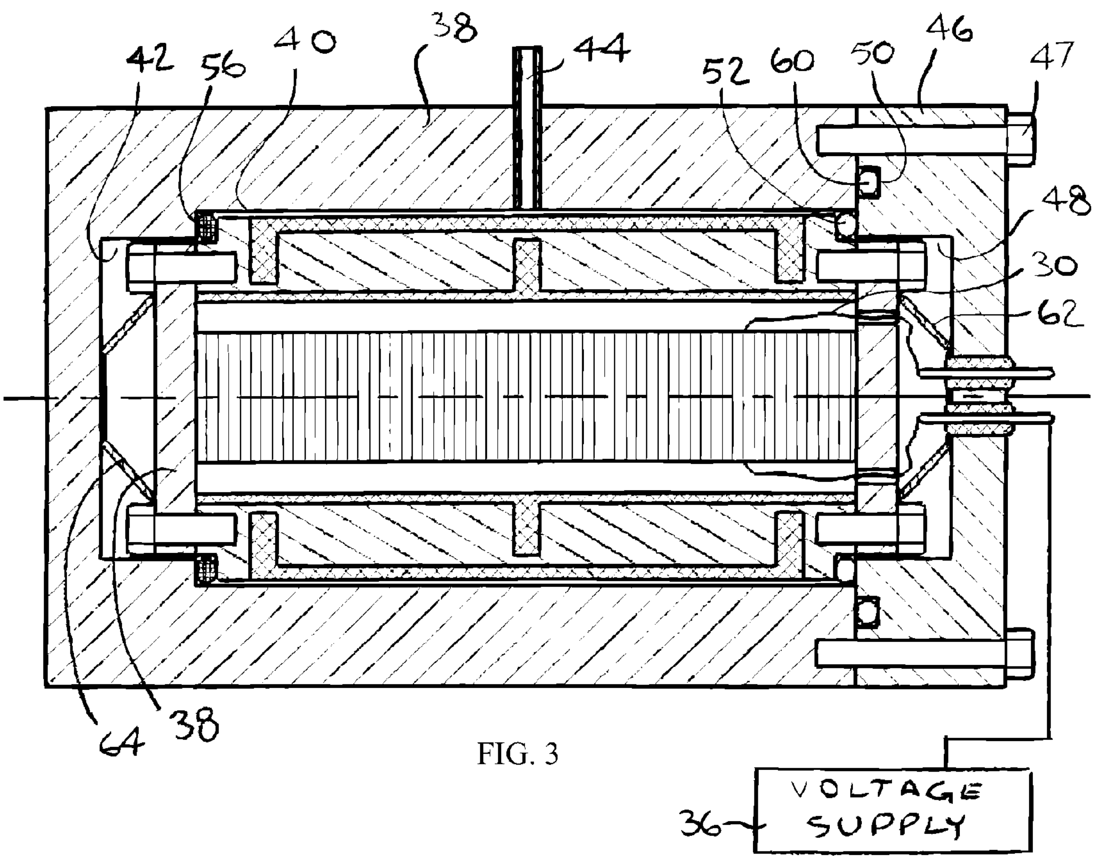
FIG. 3 is a simplified sectional illustration of a flextensional pressure oscillator, constructed and operative in accordance with an embodiment of the present invention.
Figure 4A:
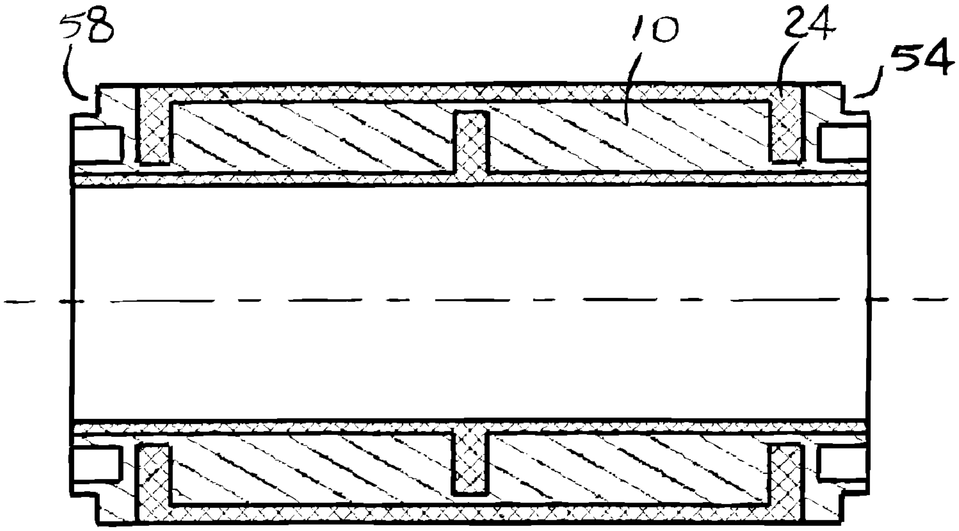
FIGS. 4A and 4B are simplified sectional and pictorial illustrations of an elastomer molding for the flextensional transducer, in accordance with an embodiment of the present invention.
Figure 4B:
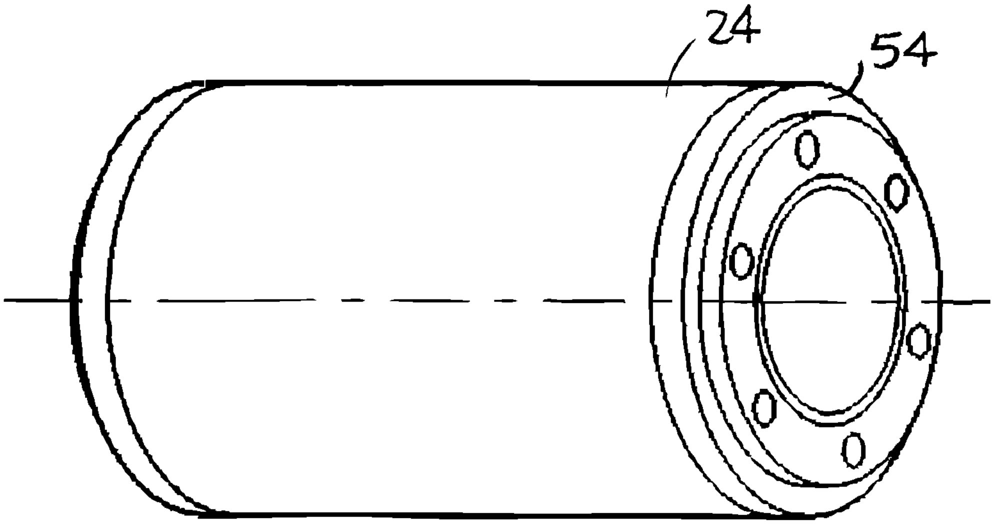

Reference is now made to FIGS. 2A-2B. A first endplate 26 is secured to the first end and has one or more holes 28 for passing therethrough electrical wires 30 (FIG. 3). A second endplate 32 is secured to the other end of frame 10. A driving member 34 is disposed longitudinally and adjoining first endplate 26 and second endplate 32. First and second endplates 26 are fastened with bolts 27.

A voltage supply 36 (FIG. 3) is provided for energizing driving member 34. Upon energization thereof, driving member 34 applies a force to first and second endplates 26 and 32 thereby causing frame 10 and molding 24 to deform elastically.

Reference is now made to FIG. 3, which illustrates a flextensional pressure oscillator. The oscillator includes a housing 38 that has a first cylindrical cavity 40 with an inner diameter slightly larger than the outer diameter of elastomeric molding 24, a second cylindrical cavity 42 with an inner diameter larger than the outer diameter of first and second endplates 26 and 32, and at least one fluid flow channel 44.

A cover 46 hermetically closes housing 38 to separate the internal cavities from the environment, and is fastened thereto with bolts 47. Cover 46 has a cylindrical cavity 48 with an inner diameter larger than the outer diameter of first and second endplates 26 and 32 and a sealing groove 50. A first seal 52 is disposed between a first sealing groove 54 (FIG. 1A, 1B, 4A, 4B) formed in frame 10 and cover 46. A second seal 56 is disposed between a second sealing groove 58 (FIG. 1A, 4A) of frame 10 and second cylindrical cavity 42 of housing 38. A third seal 60 (FIG. 3) is disposed in the sealing groove 50 of cover 46.

A first spring 62 is disposed between first endplate 26 and cover 46. A second spring 64 is disposed between second endplate 32 and housing 38.

It will be appreciated by persons skilled in the art that the present invention is not limited to what has been particularly shown and described hereinabove. Rather, the scope of the present invention includes both combinations and subcombinations of the various features described hereinabove, as well as variations and modifications thereof that are not in the prior art, which would occur to persons skilled in the art upon reading the foregoing description.

What is claimed is:

1. An apparatus for producing pressure oscillation of a fluid when an oscillating voltage is applied, comprising:

a flextensional acoustical transducer comprising:

a tubular frame covered by an elastomeric molding;

a first endplate having at least one hole for passing therethrough electrical wires secured to one end of said frame and a second endplate secured to another end thereof;

a driving member disposed longitudinally and adjoining said first endplate and said second endplate;

voltage supplying means for energizing said driving member operating in response thereto to apply force to said first endplate and said second endplate thereby causing said frame and said molding to deform elastically; and a housing that envelops said frame and which is sealed thereto with a cover, aid housing comprising at least one fluid flow channel for fluid to flow therethrough to surround the elastomeric molding of said frame.

2. Apparatus of claim 1, wherein said frame of said flextensional acoustical transducer comprises an internal circular slot disposed in the middle thereof to form a middle flexible region, a first external circular slot nearby one end thereof to form a first end flexible region, and a second external circular slot nearby other end thereof to form a second end flexible region, and plurality of longitudinal slits disposed in between and overlapping the said first end flexible region and the second end flexible region.

3. Apparatus of claim 2, wherein said frame of said flextensional acoustical transducer comprises an external circular slot disposed in the middle thereof to form a middle flexible region, a first internal circular slot nearby one end thereof to form a first end flexible region, and a second internal circular slot nearby other end thereof to form a second end flexible region.

* * * * *